United States Patent [19]

Hettiger

[11] Patent Number: 4,796,079
[45] Date of Patent: Jan. 3, 1989

[54] CHIP COMPONENT PROVIDING RF SUPPRESSION

[75] Inventor: James Hettiger, Indianapolis, Ind.

[73] Assignee: RCA Licensing Corporation, Princeton, N.J.

[21] Appl. No.: 183,301

[22] Filed: Apr. 11, 1988

Related U.S. Application Data

[63] Continuation of Ser. No. 634,330, Jul. 25, 1984, abandoned.

[51] Int. Cl.4 ............ H01L 23/54; H01L 23/12; H01L 23/14
[52] U.S. Cl. .................... 357/68; 357/67; 357/80
[58] Field of Search ........... 357/84, 71, 67, 68, 357/74, 38, 27, 80; 333/182, 12, 185, 81, 243; 361/424; 365/52, 2; 336/96, 192, 65

[56] References Cited

U.S. PATENT DOCUMENTS

| | | | |
|---|---|---|---|
| 3,456,215 | 7/1969 | Denes | 333/81 |
| 3,490,053 | 1/1970 | Nagai et al. | 333/81 |
| 3,550,099 | 12/1970 | Stein | 340/174 |
| 3,651,381 | 3/1972 | Nojiri | 317/101 |
| 3,781,724 | 12/1973 | Moore et al. | 333/79 |
| 3,824,518 | 7/1974 | Slenker | 336/96 |
| 4,139,881 | 2/1979 | Shimizu et al. | 361/400 |
| 4,398,342 | 8/1983 | Pitt et al. | 357/27 |
| 4,490,706 | 12/1984 | Satou et al. | 336/96 |

FOREIGN PATENT DOCUMENTS

0013364 7/1980 European Pat. Off. .
2524300 12/1975 Fed. Rep. of Germany .

OTHER PUBLICATIONS

"Information Sheets for Shield Beads"-Fair-Rite Products, Walkhill, N.Y., Jun., 1977.

Primary Examiner—Martin H. Edlow
Assistant Examiner—S. V. Clark
Attorney, Agent, or Firm—Eugene M. Whitacre; Paul J. Rasmussen; Joseph J. Laks

[57] ABSTRACT

A ferrite shield component for suppressing high frequency signals in electrical circuits, such as tuners for television receivers, is formed by surrounding an electrical conductor with ferrite material. The shield component is formed in the shape of a leadless chip to permit placement on a circuit board by chip insertion machines. The conductor pattern and ferrite material may be selected to determine particular impedance-frequency characteristics.

6 Claims, 2 Drawing Sheets

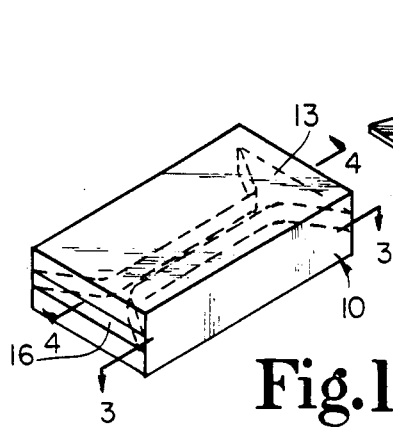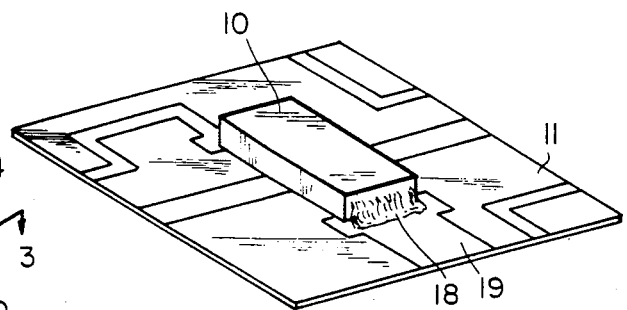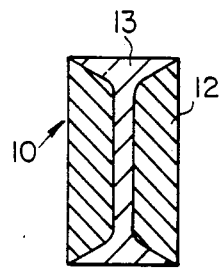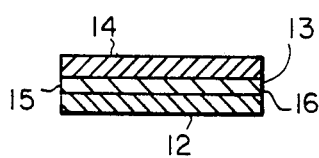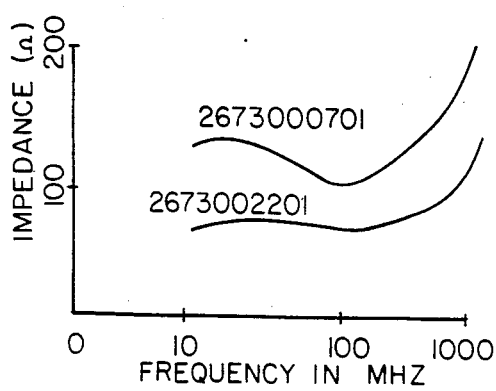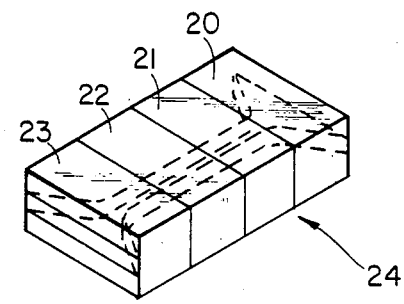

CHIP COMPONENT PROVIDING RF SUPPRESSION

This is a continuation division of application Ser. No. 634,330, filed July 25, 1984, abandoned.

This invention relates to components used in the suppression of high frequency signals in video display apparatus circuitry and, in particular, to suppression of radio frequency signals through the use of ferrite components.

Tuning and video signal processing circuits, such as those used in television receivers, computer monitors and video tape recorders, for example, require careful design to prevent undesirable signal interference. The presence of radio frequency (rf) signal energy may interact with stray circuit capacitance and lead inductance in circuits having high frequency field effect transistors, for example, to create high frequency signal oscillations that may disrupt circuit operation. Radio frequency energy may also be coupled from one circuit to another via exposed component leads, also causing undesirable circuit operation.

A solution to the problem of uncontrolled rf energy involves the use of ferrite beads located on critical component or conductor leads. The ferrite beads, typically in the shape of a ring or cylinder, act as rf chokes and attenuate the rf or high frequency current flowing in their associated leads or conductors. The ferrite beads present very little impedance at dc or low signal frequencies but present an increasing impedance as the signal frequency increases. Different ferrite compositions exhibit different impedance-frequency characteristics, which are described by the ferrite manufacturer.

The requirement for a ferrite bead at a particular circuit location is often not known until the circuit is constructed and tested. When a need for a ferrite bead is determined, it is often necessary to place the bead on the component lead or conductor by hand, thereby increasing the circuit manufacturing time and cost.

There is an increasing utilization of leadless chip components by circuit designers in order to reduce circuit size requirements. These leadless chips are typically small, thin, flat components which are applied to the conductor side of a printed circuit board by insertion machines. The chips are held in place on the board of an adhesive, such as epoxy. Edges of the chip may comprise the component electrical terminals. Electrical contact between the chip terminals and the circuit board is via a solder bridge typically applied by a wave or reflow soldering apparatus.

Leadless chip components are particularly useful in the design of tuning circuits for video equipment, such as television receivers, computer monitors and video cassette recorders. The undesirable transfer of rf energy via exposed leads between conventional leaded components can be better controlled through the use of leadless chip components. This may in turn permit accurate predictions as to the locations where ferrite beads are necessary, thus reducing circuit design and testing time. The placement of the ferrite bead in the circuit, however, would still be required to be done by hand or by conventional axial leaded component insertion techniques.

In accordance with an aspect of the present invention, a leadless chip component for application to an electrical printed circuit board comprises an electrical conductor having first and second leadless contact terminals. Magnetically permeable ferrite material substantially surrounds the conductor with the first and second leadless contact terminals being accessible for providing electrical contact to the conductor.

In the accompanying drawing,

FIG. 1 is an isometric schematic view of an electrical component in accordance with an aspect of the present invention;

FIG. 2 is an isometric view of the electrical components shown in FIG. 1, illustrating a representative mounting arrangement;

FIG. 3 is a top cross-sectional view of the electrical component shown in FIG. 1, taken along line 3—3;

FIG. 4 is a side elevational cross-sectional view of the electrical component shown in FIG. 1, taken along line 4—4;

FIG. 5 is a graph illustrating a representative electrical characteristic of a component similar to that shown in FIG. 1;

FIG. 6 is an isometric schematic view of an electrical component illustrating another aspect of the present invention;

FIG. 8 is a schematic diagram of a circuit incorporating an electrical component similar to that shown in FIGS. 1, 6 or 7a.

Figure 7A:
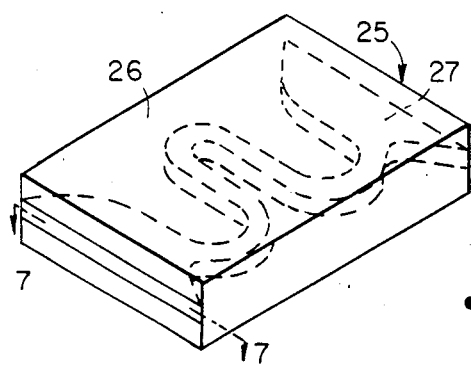
FIG. 7a is an isometric schematic view of an electrical component illustrating another aspect of the present invention.

Referring to FIG. 1, there is shown an electrical component 10 that provides rf or high frequency signal suppression similar to that of a conventional ferrite bead, but is in the form of a surface mounted or leadless chip component. In FIG. 2, component 10 is shown mounted in place on a printed circuit board 11. Component 10 is applied to the conductor or foil side of circuit board 11 by commercially available leadless chip insertion machines of known construction and held in place by epoxy using conventional chip epoxying techniques. Electrical connection to the circuit board is via conventional reflow or wave soldering techniques, which forms a solder bridge connection 18 with the foil conductor 19.

As shown in FIGS. 3 and 4, component 10 comprises a first layer of ferrite material 12. A layer of conductor material 13 may be vapor deposited onto the ferrite layer 12. A second layer 14 of ferrite material may be compressed onto the first layer 12 and conductor layer 13. Conductor 13 will therefore be encompassed or surrounded by ferrite material, except for a surface 15 and a surface 16 located at opposite ends of component 10 which form leadless contacts that permit electrical access to conductor 13 via a solder bridge connection 18 such as is shown in FIG. 2. Conductor 13 may also be formed as a conductor sheet or wire, with the ferrite material being molded and cured around the conductor. Other means by which ferrite material can be made to substantially surround a length of conductor material are of course possible. At high frequencies, above several hundred megahertz, for example, it becomes quite important to have close contact between the ferrite material and the conductor, since the skin effect causes all conductor current flow to occur within a few thousandths of an inch of the conductor surface. The ferrite material is, therefore, most effective if it is in close contact with the electrical conductor. A technique to accomplish this would have the conductor material vapor deposited onto and sandwiched between two slabs of ferrite material.

A possible method for forming a quantity of ferrite shield chip components may comprise forming a thin sheet of ferrite material onto a flat surface. A conductor pattern would then be vapor deposited onto the ferrite layer. A second ferrite layer would then be placed onto the first ferrite layer and conductor layer. The ferrite would then be cured. The completed material would then be machined or otherwise separated into individual ferrite chip components.

The circuit impedance provided by a given tape of ferrite material for a representative component 10 is in part determined by the frequency of the current flowing through conductor 13. With dc or low frequency signals, the impedance provided by components 10 is very small or negligible. As current flows through conductor 13, it creates a magnetic field. As the signal frequency increases, the permeability of the ferrite material increases, causing a greater portion of the magnetic field to pass through the ferrite material. This raises the circuit impedance in the vicinity of component 10, effectively suppressing undesirable high frequency signals. A typical impedance versus signal frequency response curve is shown in FIG. 5 for two different ferrite materials manufactured by Fair-Rite Products Corp. of Wallkill, N.Y., and identified in FIG. 5. As can be seen in FIG. 5, the type of ferrite material can influence the circuit impedance at a given frequency. It is possible to produce a particular impedance versus frequency response characteristic by forming the ferrite shield component from a plurality of different ferrite materials. As shown in FIG. 6, shield elements 20, 21, 22 and 23, disposed along the longitudinal conductor signal path comprise the complete ferrite shield component 24. Each shield element may comprise a different type of ferrite material having different impedance-frequency characteristics. Each shield element will contribute to the overall impedance-frequency characteristic so that it is possible to design a circuit component having virtually any desired impedance-frequency characteristic.

The impedance presented by the ferrite shield component is also determined by the amount of ferrite material and, in particular, by the conductor path length through the ferrite material. In applications using conventional tubular ferrite beads, it is often necessary to use two or more beads in series to provide the desired signal attenuation.

Figure 7B:
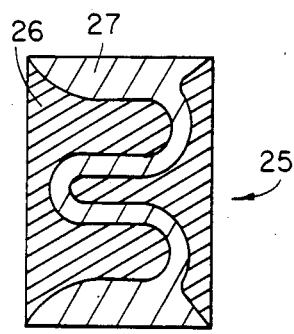
FIG. 7b is a top cross-sectional view of the electrical component shown in FIG. 7a, taken along line 7—7.

It is of course possible to utilize two or more ferrite shield components, such as component 10, to provide additional signal attenuation. However, this reduces the advantages provided by the small size of the components. FIG. 7 illustrates a means by which a single component can provide signal attenuation otherwise requiring two or more components. A ferrite shield component 25 comprises ferrite material 26 surrounding a conductor 27. Conductor 27 is formed in a circuitous path, which increases the signal path length through the ferrite material 26 and thereby increases the circuit impedance and consequently the amount of signal attenuation.

Figure 8:
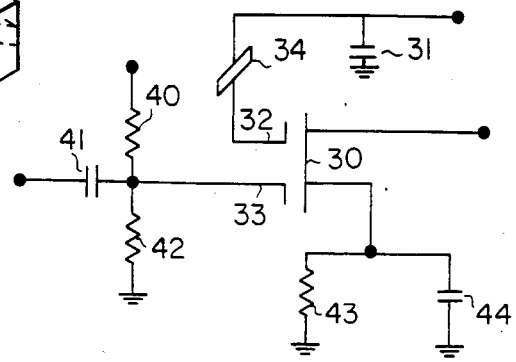
Figure 9:
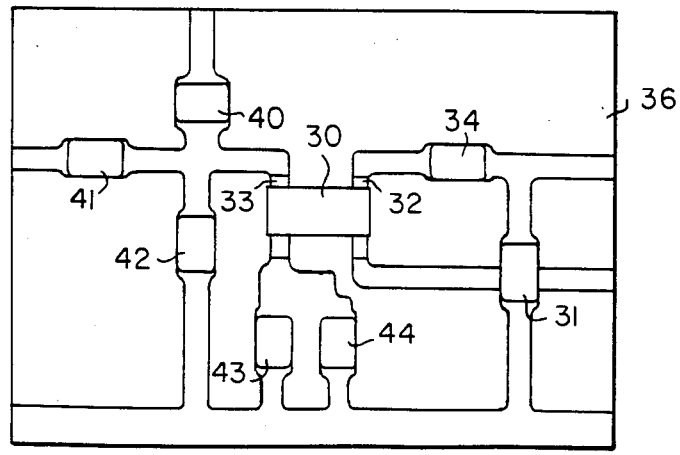
FIG. 9 is a top plan view of a circuit board incorporating components forming the circuit shown in FIG. 8.

FIG. 8 illustrates a schematic diagram of a portion of an electrical circuit, incorporating a dual gate MOSFET 30, illustratively used as an rf amplifier in a television receiver tuner, such as that found in the CTC-121 Color Television Chassis, manufactured by RCA Corporation. A capacitor 31 provides a high frequency path to ground to prevent feedback from gate 32 to gate 33 which could disrupt the operation of MOSFET 30. Capacitor 31 may, however, form a high frequency oscillator with the inductance of the conductor leading to gate 32. In order to suppress these oscillations, a ferrite shield component 34 is placed on the gate 32 conductor. The use of a shield component such as is shown in FIGS. 1, 6 or 7a allows the placement of component 34 close to the gate 32 terminal, particularly important in tuning circuits in order to eliminate rf coupling via component leads. The use of ferrite chip component 34 results in efficient use of space on the circuit board. Component 34 may be placed via an automatic insertion machine, which is faster and more efficient than placement by hand. Manual placement was previously required since an axial component insertion machine could not place a component close enough to MOSFET 30 to effectively suppress the high frequency signals. FIG. 9 illustratively shows MOSFET 30, capacitor 31, and ferrite shield component 34 as surface mounted components in place on a circuit board 36. Corresponding components in FIG. 8 and 9 are designated using the same reference numerals.

It is also desirable in some circumstances to place ferrite beads on the leads of bipolar transistors to suppress high frequency oscillations. The use of leadless transistor chips makes this impossible, however. The use of ferrite beads having axial conductor leads does not allow the placement of the ferrite bead close enough to the transistor to efficiently utilize circuit board space. The use of a ferrite shield component such as shown in FIGS. 1, 6 or 7a permits the desirable close spacing between the transistor and the ferrite shield component while enabling the efficient utilization of similar component insertion equipment and technology.

What is claimed is:

1. A surface mounted ferrite shield component for application to an electrical printed circuit board in order to provide high frequency signal attenuation, comprising electrical conductor means having first and second leadless contact terminals and magnetically permeable ferrite material forming a ferrite body that substantially surrounds said conductor means, with said contact terminals being spaced apart and located at respective ends of said body, said first and second leadless contact terminals of said conductor means being accessible for providing electrical contact to said conductor means by circuitry associated with said printed circuit board, thereby permitting said high frequency signal to flow from one of said contact terminals to the other via a signal path provided by said conductor means in order to subject said high frequency signal to attenuation by the ferrite body along the signal path, wherein said conductor means defines a circuitous path located in a single plane and extending between said ends of said ferrite body to increase the length of said signal path inside the body for increasing the amount of high frequency signal attenuation provided by said surface mounted ferrite shield component.

2. The arrangement defined in claim 1, wherein said electrical printed circuit board comprises an electrically conductive foil pattern and wherein electrically conductive solder bridges are formed between said first and second leadless contact terminals and respective areas of said electrically conductive foil pattern.

3. An electrical ferrite shield chip component for providing high frequency signal suppression comprising: electrical conductor means and a ferrite body substantially surrounding said electrical conductor means and generally forming a rectangular parallelepiped, said electrical conductor means being accessible as leadless contact means at opposite ends of said rectangular parallelpiped for making electrical contact to said electrical conductor means by printed circuit board circuitry, thereby permitting said high frequency signal to flow from one of said contact terminals to the other via a signal path provided by said conductor means in order to subject said high frequency signal to attenuation by the ferrite body along the signal path, wherein said conductor means defines a circuitous path located in a single plane and extending between said ends of said parallelepiped to increase the length of said signal path inside the ferrite body for increasing the amount of high frequency signal attenuation provided by said ferrite shield chip component.

4. The arrangement defined in claim 3, wherein said ferrite shield means comprises a plurality of different ferrite materials defining distinct zones, each of said zones exhibiting different electrical frequency-impedance characteristics.

5. An electrical circuit comprising:
 a printed circuit board;
 a plurality of surface mounted components mounted on said printed circuit board;
 a transistor, having a plurality of electrical terminals, mounted on said circuit board and generating undesirable high frequency signal;
 a high frequency signal suppression surface mounted component, mounted adjacent to said transistor and electrically coupled to one of said electrical terminals of said transistor, said component comprising an electrical conductor and a ferrite body surrounding said electrical conductor to form leadless contacts spaced apart and located at respective ends of said body for providing electrical connection by said high frequency suppression surface mounted component to said transistor, thereby permitting said high frequency signal to flow between said leadless contacts via a signal path provided by said electrical conductor in order to subject said high frequency signal to attenuation by the ferrite body along the signal path, wherein said conductor defines a circuitous path located in a single plane and extending between said ends of said ferrite body to increase the length of said signal path inside the body for increasing the amount of high frequency signal attenuation provided by said suppression component.

6. The arrangement defined in claim 5, wherein said transistor comprises a surface mounted component.

* * * * *